United States Patent
Westerberg et al.

(10) Patent No.: US 9,960,292 B2
(45) Date of Patent: May 1, 2018

(54) RADIALLY ARRANGED METAL CONTACT FINGERS FOR SOLAR CELLS

(71) Applicant: SunPower Corporation, San Jose, CA (US)

(72) Inventors: Staffan Westerberg, Mountain View, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 133 days.

(21) Appl. No.: 15/065,320

(22) Filed: Mar. 9, 2016

(65) Prior Publication Data

US 2016/0254400 A1    Sep. 1, 2016

Related U.S. Application Data

(63) Continuation of application No. 13/591,641, filed on Aug. 22, 2012, now Pat. No. 9,306,085.

(51) Int. Cl.
*H01L 31/044* (2014.01)
*H01L 31/0224* (2006.01)
*H01L 31/05* (2014.01)

(52) U.S. Cl.
CPC ........... *H01L 31/022441* (2013.01); *H01L 31/022433* (2013.01); *H01L 31/0516* (2013.01); *Y02E 10/50* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 2008/0223437 A1* | 9/2008 | De Ceuster | ..... H01L 31/022433 136/256 |
| 2010/0144218 A1* | 6/2010 | Rose | .................... H01L 31/0508 439/883 |

* cited by examiner

*Primary Examiner* — Bach T Dinh
(74) *Attorney, Agent, or Firm* — Okamoto & Benedicto LLP (57) ABSTRACT

A solar cell includes negative metal contact fingers and positive metal contact fingers. The negative metal contact fingers are interdigitated with the positive metal contact fingers. The metal contact fingers, both positive and negative, have a radial design where they radially extend to surround at least 25% of a perimeter of a corresponding contact pad. The metal contact fingers have bend points, which collectively form a radial pattern with a center point within the contact pad. Exactly two metal contact pads merge into a single leading metal contact pad that is wider than either of the exactly two metal contact pads.

19 Claims, 10 Drawing Sheets

RADIALLY ARRANGED METAL CONTACT FINGERS FOR SOLAR CELLS

CROSS-REFERENCE TO RELATED APPLICATION

This application is a continuation of U.S. application Ser. No. 13/591,641, filed on Aug. 22, 2012, now U.S. Pat. No. 9,306,085, which is incorporated herein by reference in its entirety.

TECHNICAL FIELD

Embodiments of the subject matter described herein relate generally to solar cells. More particularly, embodiments of the subject matter relate to solar cell metal contact fingers.

BACKGROUND

Solar cells are well known devices for converting solar radiation to electrical energy. A solar cell includes P-type and N-type diffusion regions. Solar radiation impinging on the solar cell creates electrons and holes that migrate to the diffusion regions, thereby creating voltage differentials between the diffusion regions. Metal contact fingers are electrically coupled to the diffusion regions. An external electrical circuit, in turn, may include leads that are coupled to the metal contact fingers to allow the electrical circuit to be powered by the solar cell. The present invention provides metal contact finger arrangements that help improve solar cell efficiency.

BRIEF SUMMARY

In one embodiment, a solar cell includes negative metal contact fingers and positive metal contact fingers. The negative metal contact fingers are interdigitated with the positive metal contact fingers. The metal contact fingers, both positive and negative, have a radial design where they radially extend to and surround at least 25% of a perimeter of a corresponding contact pad. The metal contact fingers have bend points, which collectively form a radial pattern with a center point within the contact pad. Exactly two metal contact pads merge into a single leading metal contact pad that is wider than either of the exactly two metal contact pads.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following drawings, wherein like reference numbers refer to similar elements throughout the drawings.

DETAILED DESCRIPTION

In the present disclosure, numerous specific details are provided, such as examples of structures, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
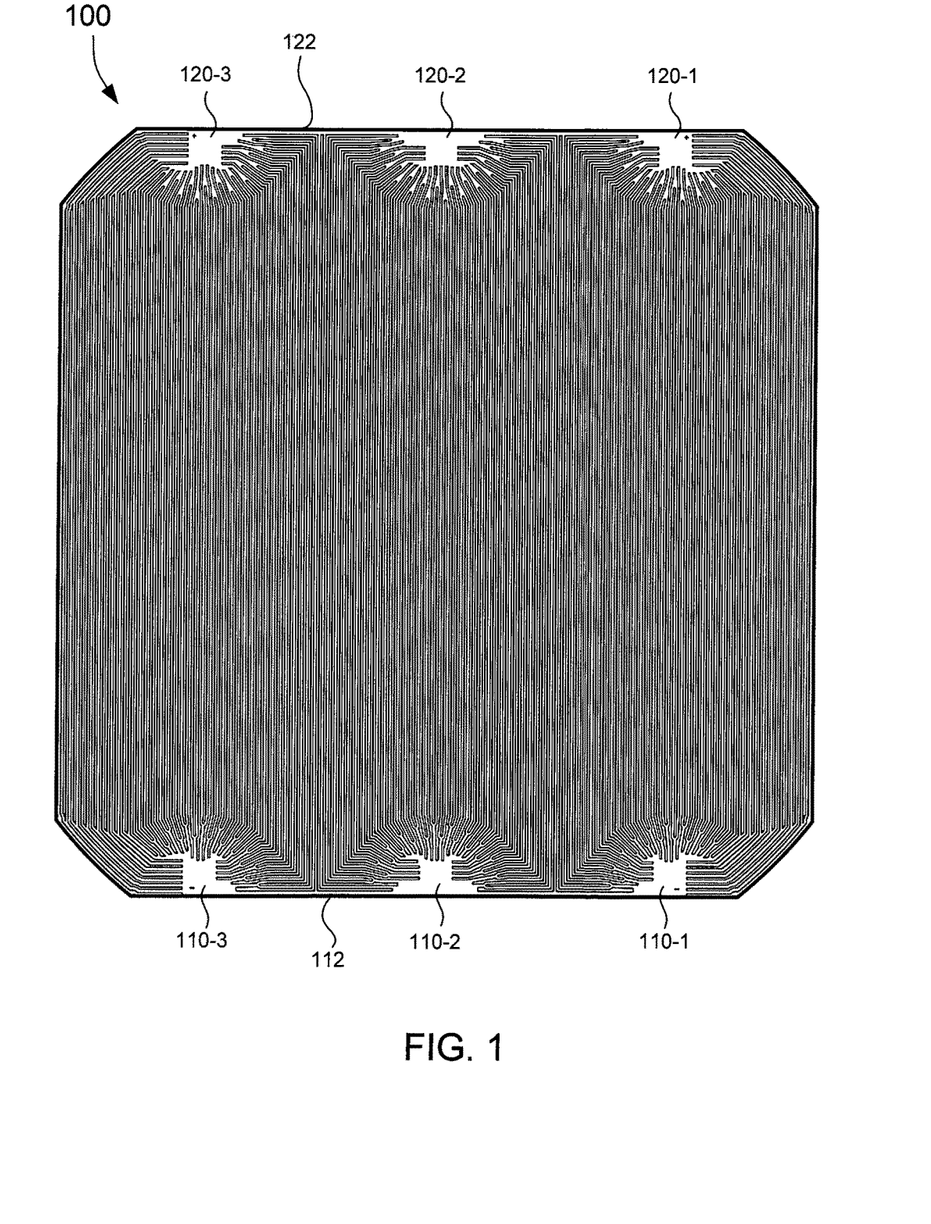
FIG. 1 shows a plan view of a backside of a solar cell in accordance with an embodiment of the present invention.

FIG. 1 shows a plan view of a backside of a solar cell 100 in accordance with an embodiment of the present invention. In the example of FIG. 1, the solar cell 100 is a backside junction solar cell in that both its diffusion regions and the metal contact fingers coupled to the diffusion regions are on the backside of the solar cell 100. The backside of the solar cell 100 is opposite the front side that faces the sun during normal operation.

The solar cell 100 includes a plurality of negative contact pads 110 (i.e., 110-1, 110-2, and 110-3) and positive contact pads 120 (i.e., 120-1, 120-2, and 120-3). A contact pad provides a surface on which an external interconnect lead may be attached, e.g., by soldering, to connect the solar cell 100 to another solar cell or an external electrical circuit, such as a load. The solar cell 100 has a negative edge 112 and a positive edge 122. As its name implies, the negative edge 112 is the edge of the solar cell 100 where the negative contact pads 110 are located. The negative contact pads 110-1 and 110-3 are corner contact pads, and the negative contact pad 110-2 is a center contact pad. Similarly, the positive edge 122 is the edge of the solar cell 100 where the positive contact pads 110 are located. The positive contact pads 120-1 and 120-3 are corner contact pads, and the positive contact pad 120-2 is a center contact pad. In general, a solar cell may have more or fewer contact pads. Within the same solar cell 100, the negative contact pads 110 electrically connect to negative metal contact fingers but not to positive metal contact fingers, and the positive contact pads 120 electrically connect to positive metal contact fingers but not to negative metal contact fingers.

Figure 2:
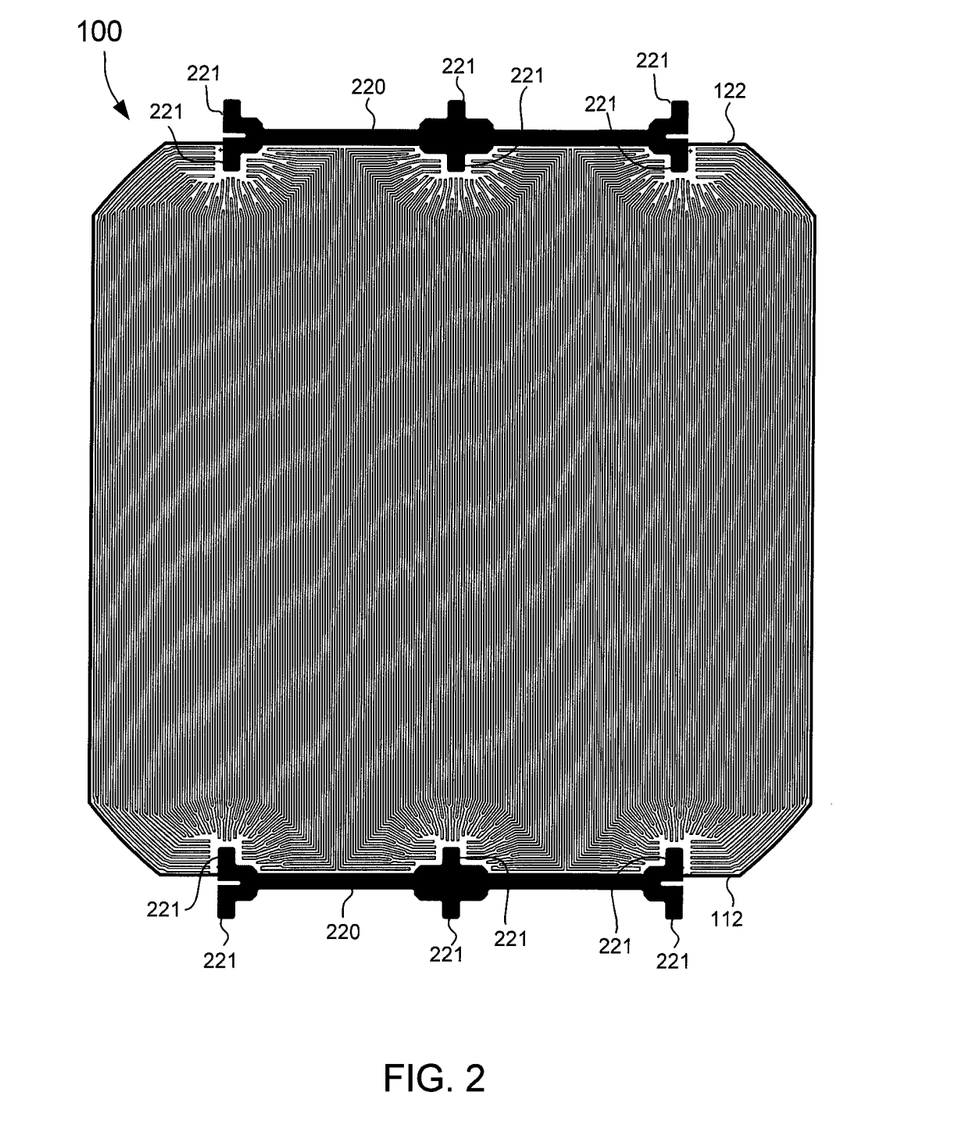
FIG. 2 shows the solar cell of FIG. 1 with solar cell interconnects in accordance with an embodiment of the present invention.

To form serially connected solar cells as in a solar cell module, the negative contact pads 110 of the solar cell 100 may be coupled to positive contact pads of another solar cell, and so on. FIG. 2 shows the solar cell 100 with solar cell interconnects 220 in accordance with an embodiment of the present invention. The positive edge 122 and the negative edge 112 are labeled in FIG. 2 to assist in locating the negative contact pads 110 and the positive contact pads 120, which are not labeled in FIG. 2 to avoid cluttering the drawing. An interconnect 220 couples the solar cell 100 to another solar cell. In the example of FIG. 2, an interconnect 220 has tabs 221 that are attached to corresponding contact pads. For example, a tab 221 may be soldered onto a positive contact pad 120 of the solar cell 100, and an opposing tab 221 of the same interconnect 220 may be soldered onto a negative contact pad of another solar cell (not shown). The same applies for the interconnect 220 attached to negative contact pads 110 on the negative edge 112. Other example interconnects that may be employed include those disclosed in commonly-assigned U.S. Pat. No. 8,148,627, which is incorporated herein by reference in its entirety.

Figure 3:
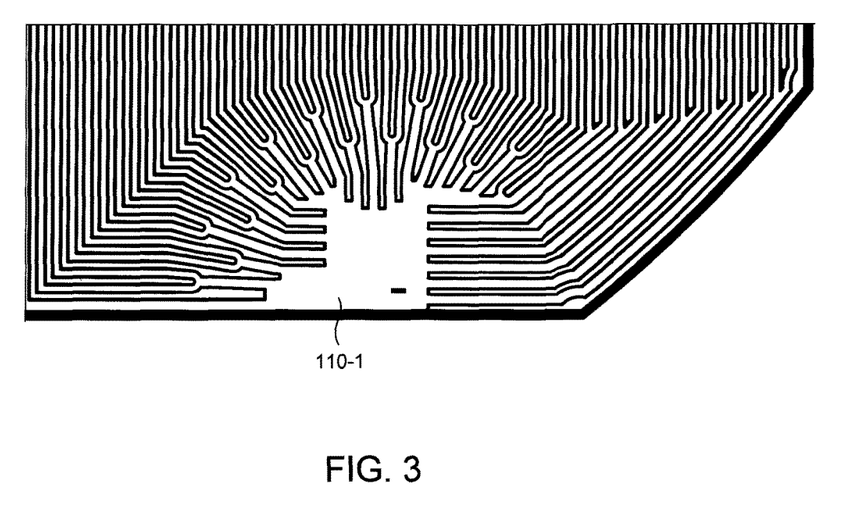
FIGS. 3 and 4 show magnified views of a corner negative contact pad of the solar cell of FIG. 1.
Figure 4:
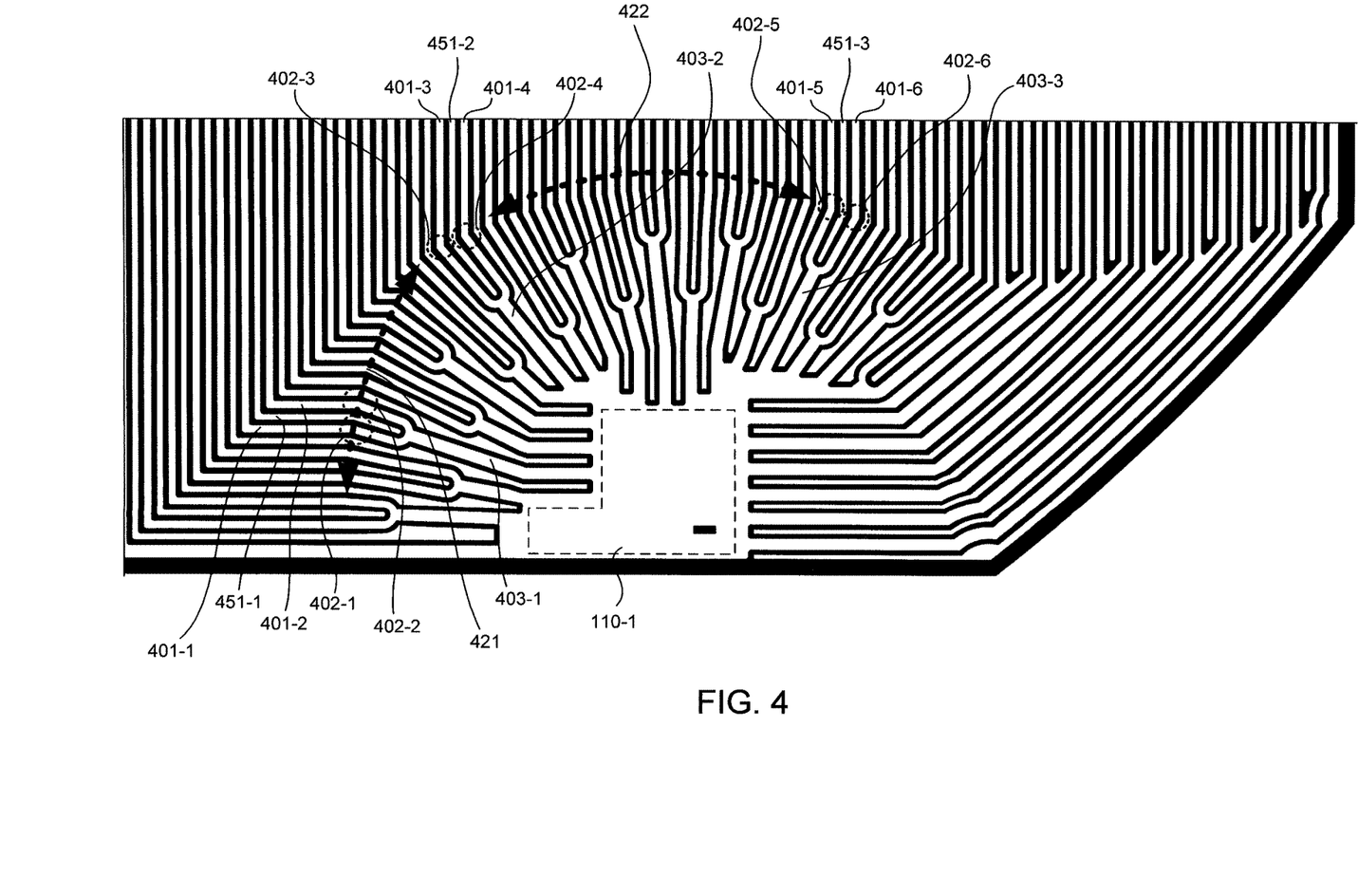

FIGS. 3 and 4 show magnified views of the corner negative contact pad 110-1. FIG. 3 shows the negative contact pad 110-1 without labels to provide an uncluttered drawing for reference. FIG. 4 shows the same view as FIG. 3 but with labels for pointing out features of the solar cell 100. Still, not all features are labeled in FIG. 4 for clarity of illustration. In the example of FIGS. 1-10, a white space within the solar cell 100 is covered by a metallic material (e.g., copper) and a black space between white spaces represents an electrical insulator.

The solar cell 100 comprises negative metal contact fingers 401 (i.e., 401-1, 401-2, 401-3, etc.) that are coupled to corresponding negative contact pads 110. In the example of FIG. 4, the perimeter of the negative contact pad 110-1 has been bounded by dashes for illustration purposes. In one embodiment, to minimize resistive loses, exactly two negative metal contact fingers 401 are merged into a single leading negative metal contact finger 403 (i.e., 403-1, 403-2, 403-3, etc.) that is wider than either of the exactly two negative metal contact fingers 401. The leading negative metal contact finger 403 is, in turn, coupled to a corresponding negative contact pad 110. As an example, negative metal contact fingers 401-1 and 401-2 merge into a leading negative metal contact finger 403-1, which in turn is coupled to the negative contact pad 110-1. The leading negative metal contact finger 403-1 is wider than either the negative metal contact finger 401-1 or 401-2. Other examples that are labeled in FIG. 4 include negative metal contact fingers 401-3 and 401-4 merging together to form the leading negative metal contact finger 403-2 and negative metal contact fingers 401-5 and 401-6 merging together to form the leading negative metal contact finger 403-3. The leading negative metal contact fingers 403-2 and 403-3 both extend to the negative contact pad 110-1. The leading negative metal contact finger 403-2 is wider than either the negative metal contact finger 401-3 or 401-4. Similarly, the leading negative metal contact finger 403-3 is wider than either the negative metal contact finger 401-5 or 401-6.

The negative metal contact fingers 401 and 403 are so named because they are coupled to corresponding N-type diffusion regions. The solar cell 100 further comprises positive metal contact fingers 451 (i.e., 451-1, 451-2, 451-3, etc.) and 453 (i.e., 453-1, 453-2, 453-3, etc.; see FIG. 8) that are coupled to corresponding P-type diffusion regions. In one embodiment, the solar cell 100 comprises interdigitated metal contact fingers. In particular, the negative metal contact fingers 401 are interdigitated with positive metal contact fingers 451. This is shown in FIG. 4 with the positive metal contact finger 451-1 being between the negative metal contact fingers 401-1 and 401-2, the positive metal contact finger 451-2 being between the negative metal contact fingers 401-3 and 401-4, and the positive metal contact finger 451-3 being between the negative metal contact fingers 401-5 and 401-6. It is to be noted that for improved efficiency, in the case of an N-type silicon substrate, the positive metal contact fingers 451 and corresponding P-type diffusion regions (i.e., emitter diffusion region) are preferably made as wide as possible between negative metal contact fingers 401.

In one embodiment, the negative metal contact fingers 401 are straight and parallel along the middle portion of the solar cell 100 but are bent to radially approach or extend toward a corresponding negative contact pad 110. This is illustrated in FIG. 4 with the bend points 402 (402-1, 402-2, 402-3, etc.) of the negative metal contact fingers 401 collectively forming a radial pattern with a center point that is within the negative contact pad 110. The bends 402 allow the metal contact fingers 401 to radially approach or extend to the negative contact pad 110. In the example of FIG. 4, the radial pattern of the bend points 402 is illustrated by dashed lines 421 and 422. In one embodiment, the radial pattern has a circumference that covers at least 25% or between 25% and 75% of the perimeter of the negative contact pad 110. The radial design together with the merging of two metal contact fingers into one metal contact finger helps increase efficiency by maximizing electrical current collection around the contact pad and decreasing dead space where little or no electrical current can be extracted.

The just described features of the negative metal contact fingers 401, leading negative metal contact fingers 403, and negative contact pads 110 are generally present in the solar cell 100, including in positive metal contact fingers 451, leading positive metal contact fingers 453, and positive contact pads 120.

Figure 5:
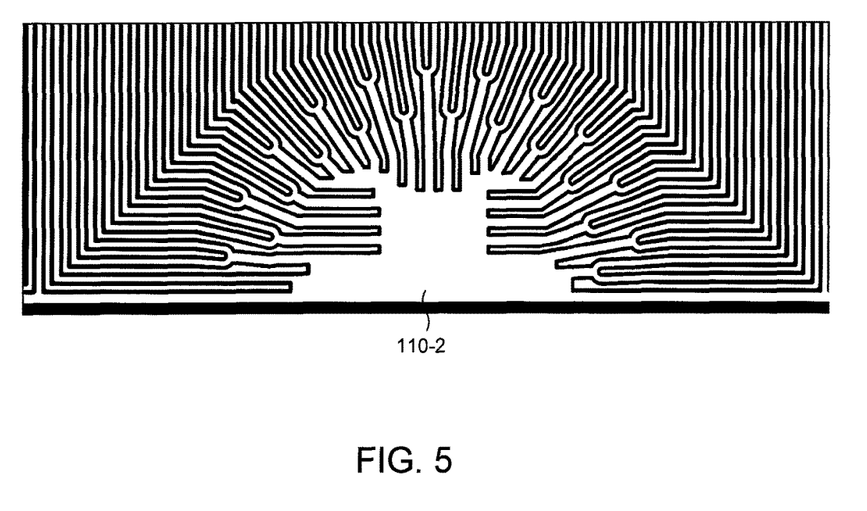
FIGS. 5 and 6 show magnified views of a center negative contact pad of the solar cell of FIG. 1.
Figure 6:
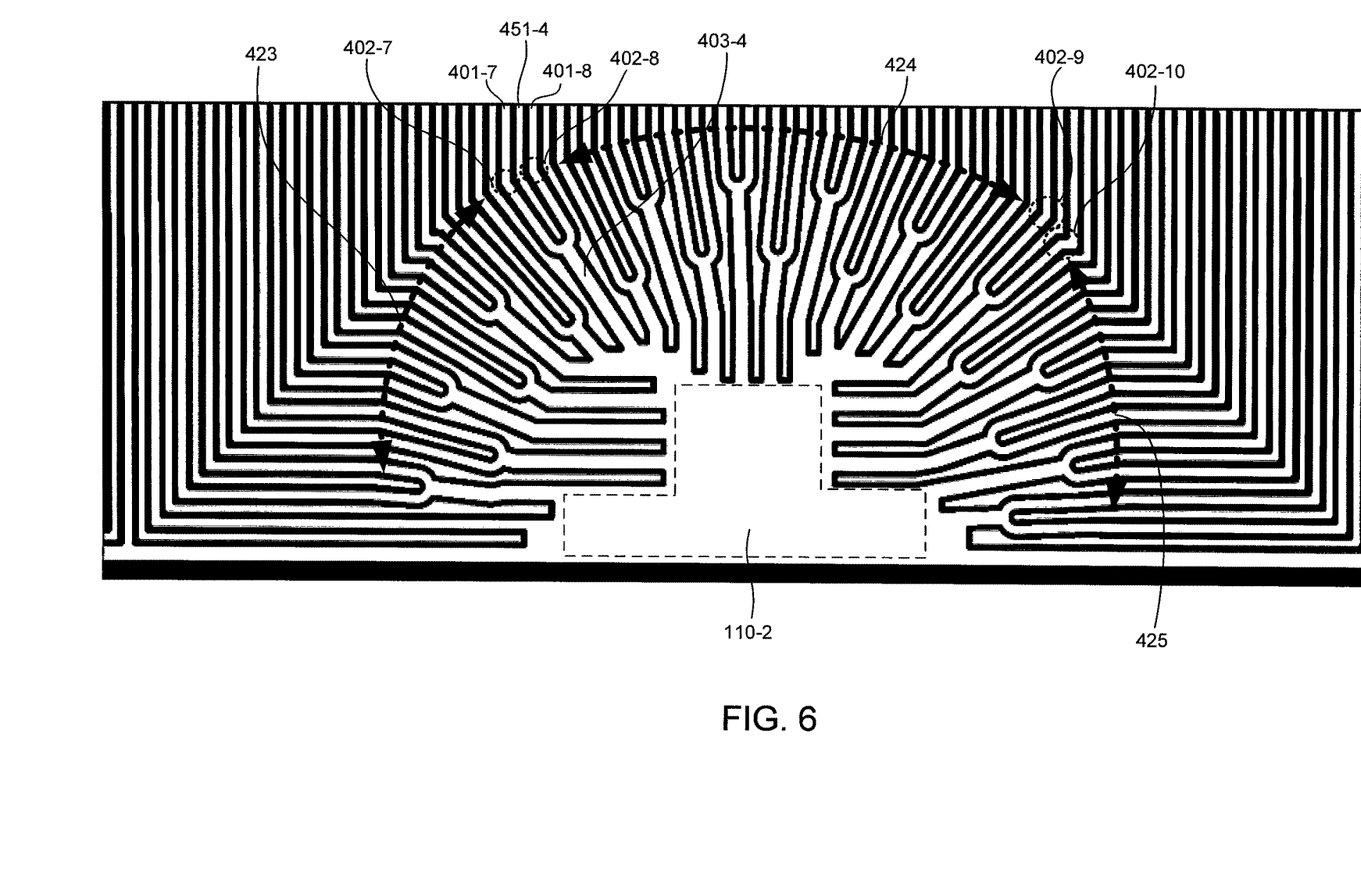

FIGS. 5 and 6 show magnified views of the center negative contact pad 110-2. FIG. 5 shows the negative contact pad 110-2 without labels. FIG. 6 shows the same view as FIG. 5 but with labels for pointing out features of the solar cell 100. Not all features are labeled in FIG. 6 for clarity of illustration.

With reference to FIG. 6, negative metal contact fingers 401-7 and 401-8 merge together to form a leading negative metal contact finger 403-4, which is wider than either the negative metal contact finger 401-7 or the negative metal contact finger 401-8. The negative metal contact fingers 401-7 and 401-8 bend at bend points 402-7 and 402-8, respectively, such that both of the negative metal contact fingers 401-7 and 401-8 and the leading negative metal contact finger 403-4 extend and point toward the negative contact pad 110-2 in a radial manner. The negative metal contact fingers 401-7 and 401-8 are interdigitated with the positive metal contact finger 451-4, which is between the negative metal contact fingers 401-7 and 401-8.

As shown in FIG. 6, the negative metal contact fingers 401 have a radial design where their respective bend points 402 (e.g., see bend points 402-7, 402-8, 402-9, and 402-10) collectively form a radial pattern with a center point within a negative contact pad 110, which in the example of FIG. 6 is the negative contact pad 110-2. The radial pattern is illustrated by dashed lines 423, 424, and 425. In the example of FIG. 6, the radial pattern has a circumference that covers 75% of the perimeter of the negative contact pad 110-2, which is generally bounded by dashes. That is, in the example of FIG. 6, the negative metal contact fingers 401 and 403 point to and surround 75% of the perimeter of the negative contact pad 110-2. The increased radial coverage compared to that in FIG. 4 is due to the central location of the negative contact pad 110-2.

Figure 7:
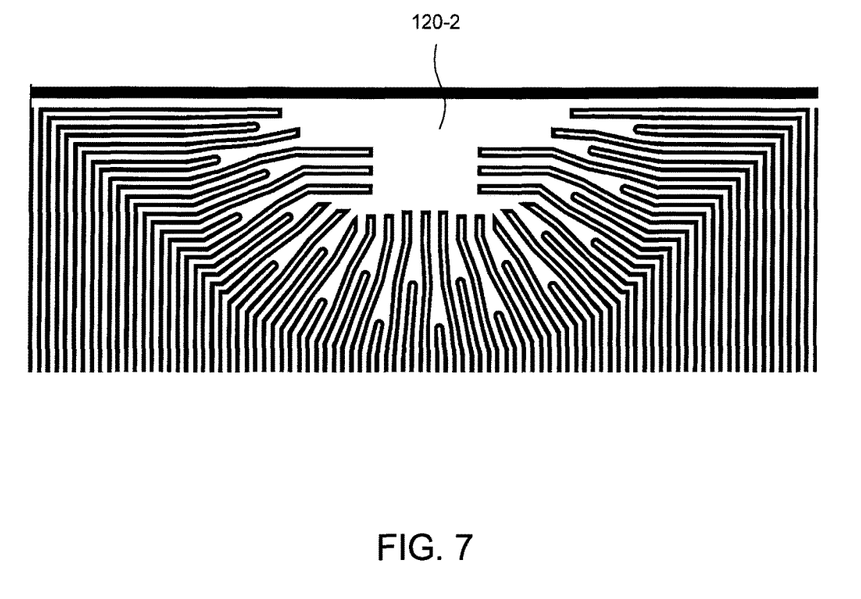
FIGS. 7 and 8 show magnified views of a center positive contact pad of the solar cell of FIG. 1.
Figure 8:
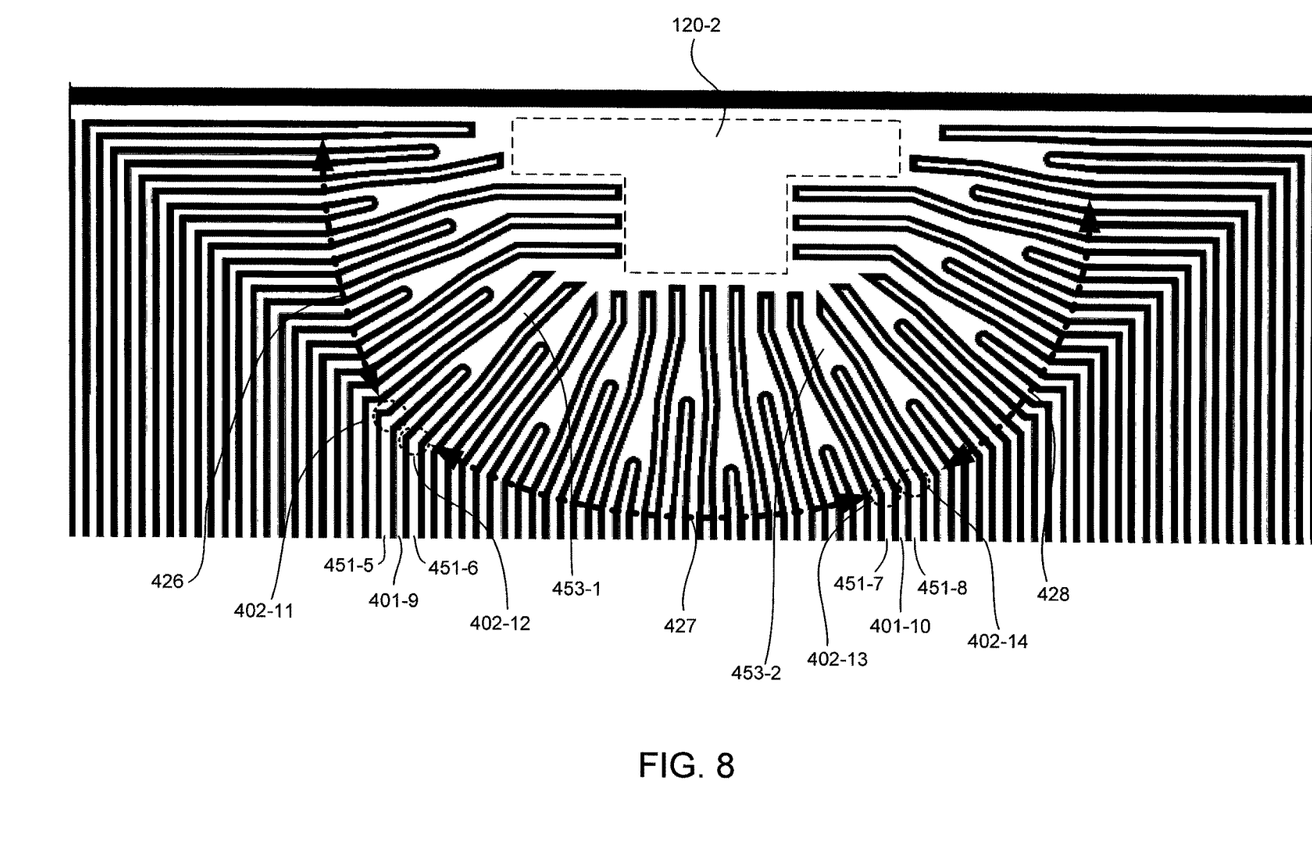

FIGS. 7 and 8 show magnified views of the center positive contact pad 120-2. FIG. 7 shows the positive contact pad 120-2 without labels. FIG. 8 shows the same view as FIG. 7 but with labels to point out features of the solar cell 100. Not all features are labeled in FIG. 8 for clarity of illustration.

With reference to FIG. 8, positive metal contact fingers 451-5 and 451-6 merge together to form a leading positive metal contact finger 453-1. To decrease resistive loses, the leading positive metal contact finger 453-1 is wider than either the positive metal contact finger 451-5 or the positive metal contact finger 451-6. For increased electrical current collection, the positive metal contact fingers 451-5 and 451-6 bend at bend points 402-11 and 402-12, respectively, such that both of the positive metal contact fingers 451-5 and 451-6 and the leading positive metal contact finger 453-1 radially extend and point toward the positive contact pad 120-2. The positive metal contact fingers 451-5 and 451-6 are interdigitated with the negative metal contact finger 401-9, which is between the positive metal contact fingers 451-5 and 451-6. Similarly, the positive metal contact fingers 451-7 and 451-8 merge to form the leading positive metal contact finger 453-2, with a negative metal contact finger 401-10 being between the positive metal contact fingers 451-7 and 451-8.

Like the negative metal contact fingers 401, the positive metal contact fingers 451 radially approach or extend to a positive contact pad 110. In the example FIG. 8, the positive metal contact fingers 451 have a radial design where their respective bend points 402 (e.g., see bend points 402-11, 402-12, 402-13, and 402-14) collectively form a radial pattern with a center point within a positive contact pad 120, which in the example of FIG. 8 is the positive contact pad 120-2. The radial pattern is illustrated by dashed lines 426, 427, and 428. In the example of FIG. 8, the radial pattern has a circumference that covers 75% of the perimeter of the positive contact pad 120-2, which has been generally bounded by dashes. In other words, in the example of FIG. 8, the positive metal contact fingers 451 and 453 point to and surround 75% of the perimeter of the positive contact pad 120-2.

Figure 9:
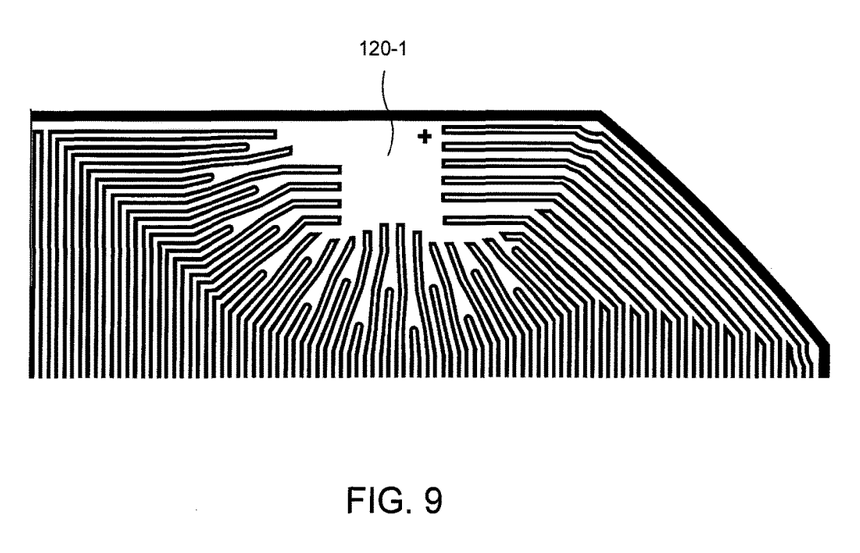
FIGS. 9 and 10 show magnified views of a corner positive contact pad of the solar cell of FIG. 1.
Figure 10:
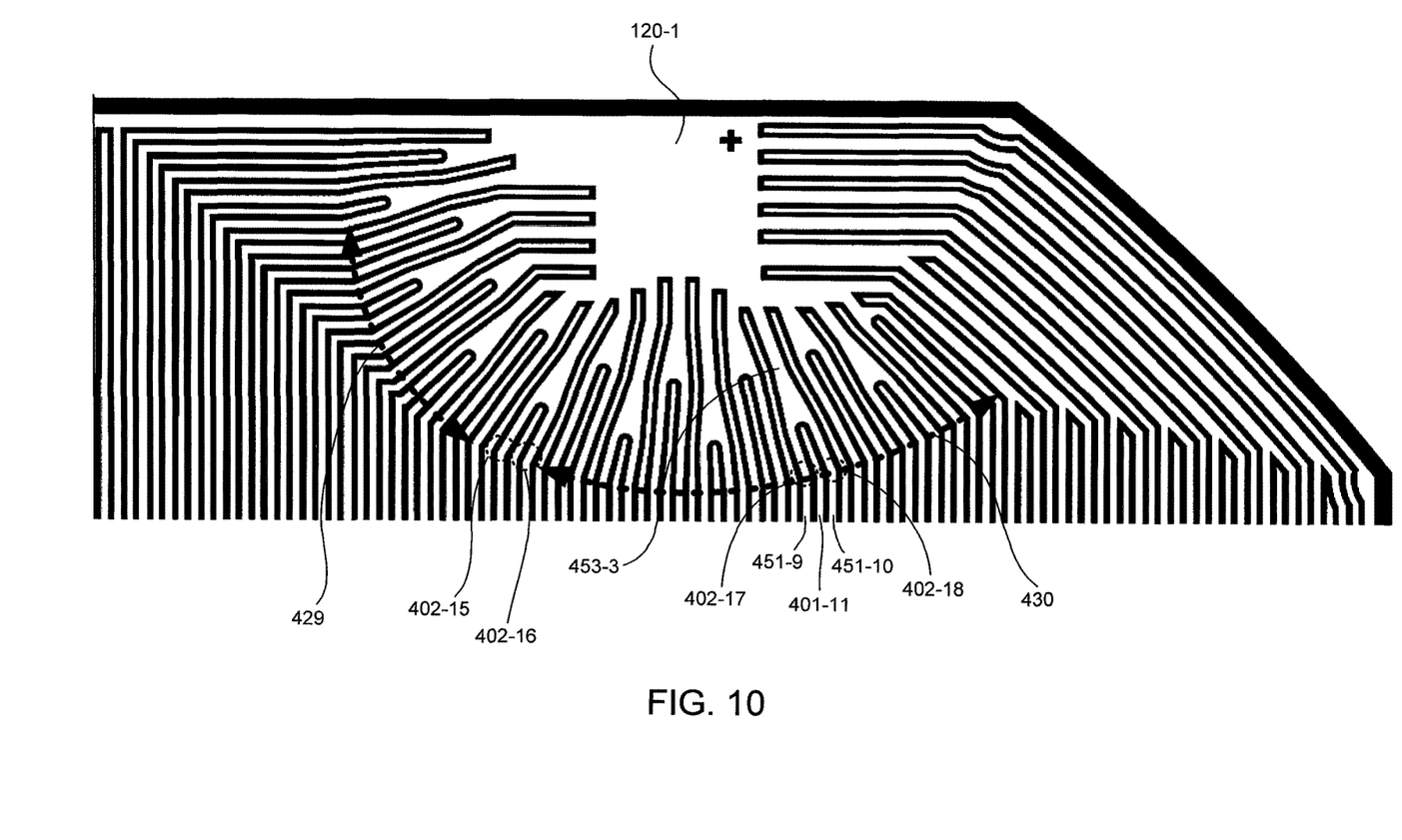

FIGS. 9 and 10 show magnified views of the corner positive contact pad 120-1. FIG. 9 shows the positive contact pad 120-1 without labels. FIG. 10 shows the same view as FIG. 9 but with labels to point out features of the solar cell 100. Not all features are labeled in FIG. 10 for clarity of illustration.

With reference to FIG. 10, positive metal contact fingers 451-9 and 451-10 merge together to form a leading positive metal contact finger 453-3. The leading positive metal contact finger 453-3 is wider than either the positive metal contact finger 451-9 or the positive metal contact finger 451-10. The positive metal contact fingers 451-9 and 451-10 bend at bend points 402-17 and 402-18, respectively, such that both of the positive metal contact finger 451-9, positive metal contact finger 451-10, and the leading positive metal contact finger 453-3 radially extend and point toward the positive contact pad 120-1. The positive metal contact fingers 451-9 and 451-10 are interdigitated with the negative metal contact finger 401-11, which is between the positive metal contact fingers 451-9 and 451-10.

As shown in FIG. 10, the positive metal contact fingers 451 have a radial design where their respective bend points 402 (e.g., see bend points 402-15, 402-16, 402-17, and 402-18) collectively form a radial pattern with a center point within a positive contact pad 120, which in the example of FIG. 10 is the positive contact pad 120-1. The radial pattern is illustrated by dashed lines 429 and 430. In the example of FIG. 10, the radial pattern has a circumference that covers at least 25% of the perimeter of the positive contact pad 120-1, which has been generally bounded by dashes. In the example of FIG. 10, the positive metal contact fingers 451 and 453 point to and surround 25% of the perimeter of the positive contact pad 120-1.

Figure 11:
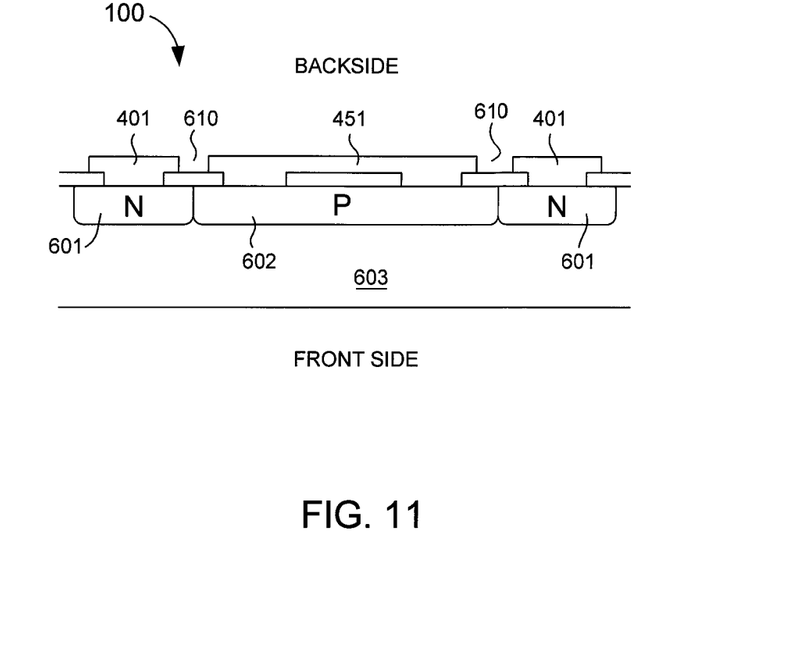
FIG. 11 shows a cross-section view of the solar cell of FIG. 1 in accordance with an embodiment of the present invention.

FIG. 11 shows a cross-section view of the solar cell 100 in accordance with an embodiment of the present invention. The solar cell 100 is a backside junction solar cell in that its N-type diffusion regions 601 and P-type diffusion regions 602 are on the backside of the solar cell. During normal operation, the front side of the solar cell 100 faces the sun to collect solar radiation. As shown in FIG. 11, the negative metal contact fingers 401 electrically connect to the N-type diffusion regions 601, and the positive metal contact fingers 451 electrically connect to the P-type diffusion regions 602 on the backside (only one positive metal contact finger and P-type diffusion region are shown for clarity of illustration). The spaces 610 may be filled with an electrical insulator (e.g., a dielectric) to isolate the negative metal contact fingers 401 from the positive metal contact fingers 451. The N-type diffusion regions 601 and P-type diffusion regions 602 may be formed in a substrate 603, or in another layer (e.g., polysilicon) formed on the substrate 603. The metal contact fingers 401 and 451 may comprise a single layer of metal (e.g., aluminum) or a stack of metals (e.g., copper/barrier layer/aluminum).

In one embodiment, the substrate 603 comprises an N-type silicon substrate. Accordingly, in that embodiment, the N-type diffusion regions 601 serve as the base of the solar cell that collects majority charge carriers, and the P-type diffusion regions 602 serve as the emitter of the solar cell that collects minority charge carriers. In another embodiment where the substrate 603 comprises a P-type silicon substrate, the P-type diffusion regions 602 serve as the base of the solar cell that collects majority charge carriers, and the N-type diffusion regions 601 serve as the emitters of the solar cell that collect minority charge carriers.

Figure 12:
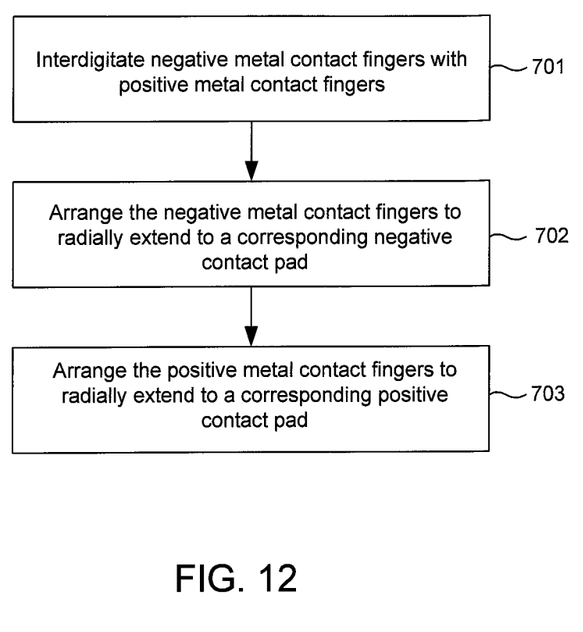
FIG. 12 shows a flow diagram of a method of arranging metal contact fingers of a solar cell in accordance with an embodiment of the present invention.

FIG. 12 shows a flow diagram of a method of arranging metal contact fingers of a solar cell in accordance with an embodiment of the present invention. As can be appreciated, the steps of the method of FIG. 12 may be performed at the same time using appropriate masking and etching techniques, for example. In particular, a metal contact finger mask may be designed such that metal contact fingers radially extend to corresponding contact pads.

In the example of FIG. 12, the method includes interdigitating a plurality of negative metal contact fingers with a plurality of positive metal contact fingers, the negative metal contact fingers being electrically connected to N-type diffusion regions on a backside of a solar cell, the positive metal contact fingers being electrically connected to P-type diffusion regions on the backside of the solar cell, the solar cell including a front side that faces the sun during normal operation (step 701). The method further includes arranging the negative metal contact fingers to have bend points that form a radial pattern having a center point within a negative contact pad of the solar cell, the negative metal contact fingers radially extending to and surrounding at least 25% of a perimeter of the negative contact pad (step 702). The method yet further includes arranging the positive metal contact fingers to have bend points that form a radial pattern having a center point within a positive contact pad of the solar cell, the positive metal contact fingers radially extending to and surrounding at least 25% of a perimeter of the positive contact pad (step 703).

Exactly two negative metal contact fingers may be arranged to merge into a single leading negative metal contact finger that extends to the negative contact pad. The single leading negative metal contact finger may be formed to be wider than either of the exactly two negative metal contact fingers. The negative metal contact fingers may be arranged to point to and surround between 25% and 75% of the perimeter of the negative contact pad. An external interconnect lead may be soldered onto the negative contact pad. The solar cell may be serially connected to another solar cell by a solar cell interconnect that electrically connects the negative contact pad to another negative contact pad of the other solar cell. The positive metal contact fingers and positive contact pads of the solar cell may have the same features as their negative counterparts.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell comprising:
a first negative contact pad at a first corner of the solar cell;
a second negative contact pad at a second corner of the solar cell;
a first plurality of negative metal contact fingers that are disposed in parallel to an edge of the solar cell and extend towards the first negative contact pad from the first corner of the solar cell;
a second plurality of negative metal contact fingers that are disposed in parallel to the edge of the solar cell and extend towards the second negative contact pad from the second corner of the solar cell;
a third plurality of negative metal contact fingers that are disposed in parallel to the edge of the solar cell and extend towards the first negative contact pad from a center of the solar cell; and
a fourth plurality of negative metal contact fingers that are disposed in parallel to the edge of the solar cell and extend towards the second negative contact pad from the center of the solar cell.

2. The solar cell of claim 1, wherein the solar cell comprises a backside contact solar cell.

3. The solar cell of claim 1, further comprising:
a third negative contact pad disposed between the first and second negative contact pads; and
a fifth plurality of negative metal contact fingers having bend points that form a radial pattern having a center point within the third negative contact pad.

4. The solar cell of claim 3, wherein exactly two negative metal contact fingers in the fifth plurality of negative metal contact fingers merge into a single leading negative metal contact finger that extends to the third negative contact pad.

5. The solar cell of claim 4, wherein the single leading negative metal contact finger is wider than either of the exactly two negative metal contact fingers.

6. The solar cell of claim 3, wherein a single external solar cell interconnect is soldered onto the first negative contact pad, the second, negative contact pad, and the third negative contact pad.

7. The solar cell of claim 6, wherein the solar cell is serially connected to another solar cell by the solar cell interconnect that electrically connects the first negative contact pad, the second negative contact pad, and the third negative contact pad to a first positive contact pad, a second positive contact pad, and a third positive contact pad, respectively, of the other solar cell.

8. A solar cell comprising:
a first contact pad at a first corner of the solar cell, the first contact pad being electrically coupled to a first diffusion region of a first polarity of the solar cell;
a first plurality of metal contact fingers that extend towards the first contact pad from the first corner of the solar cell;
a second contact pad at a second corner of the solar cell, the second contact pad being electrically coupled to a second diffusion region of a second polarity that is opposite to the first polarity of the solar cell;
a second plurality of metal contact fingers that extend towards the second contact pad from the second corner of the solar cell; and
a third plurality of metal contact fingers that extend towards the first contact pad from a center of the solar cell.

9. The solar cell of claim 8, wherein the first diffusion region is N-type and the second diffusion region is P-type.

10. The solar cell of claim 8, further comprising a third fourth plurality of metal contact fingers that radially extend towards a third contact pad.

11. The solar cell of claim 10, wherein exactly two metal contact fingers in the fourth plurality of metal contact fingers merge into a single leading metal contact finger that radially extends towards the third contact pad.

12. The solar cell of claim 11, wherein the single leading metal contact finger is wider than either of the exactly two metal contact fingers.

13. The solar cell of claim 10, wherein an external interconnect lead is soldered onto the first and third contact pads.

14. The solar cell of claim 8, wherein the solar cell comprises a backside contact solar cell.

15. A method of arranging metal contact fingers of a solar cell, the method comprising:
interdigitating a plurality of negative metal contact fingers with a plurality of positive metal contact fingers, a first set of negative metal contact fingers in the plurality of negative metal contact fingers being electrically connected to a first negative contact pad at a first corner of the solar cell, and a second set of negative metal contact fingers in the plurality of negative metal contact fingers being electrically connected to a second negative contact pad at a second corner of the solar cell;
arranging the first set of negative metal contact fingers to extend towards the first negative contact pad from the first corner of the solar cell;
arranging the second set of negative metal contact fingers to extend towards the second negative contact pad from the second corner of the solar cell;
arranging a third set of negative metal contact fingers in the plurality of negative metal contact fingers to extend towards the first negative contact pad from a center of the solar cell; and
arranging a fourth set of negative metal contact fingers in the plurality of negative metal contact fingers to extend towards the second negative contact pad from the center of the solar cell.

16. The method of claim 15, further comprising:
arranging a fifth set of negative metal contact fingers in the plurality of negative metal contact fingers to radially extend towards a third negative contact pad.

17. The method of claim 16, further comprising:
arranging exactly two negative metal contact fingers in the fifth set of negative metal contact fingers to merge into a single leading negative metal contact finger that extends towards the third negative contact pad.

18. The method of claim 17, wherein the single leading negative metal contact finger is formed to be wider than either of the exactly two negative metal contact fingers.

19. The method of claim 15, further comprising:
soldering an external interconnect lead onto the first and second negative contact pads.

* * * * *